(12) United States Patent
Venna

(10) Patent No.: US 9,954,630 B1
(45) Date of Patent: Apr. 24, 2018

(54) MUX FOR SERDES TRANSMITTER HAVING LOW DATA JITTER

(71) Applicant: Xilinx, Inc., San Jose, CA (US)

(72) Inventor: Karthik C. Venna, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 619 days.

(21) Appl. No.: 14/315,268

(22) Filed: Jun. 25, 2014

(51) Int. Cl.
*H04J 3/06* (2006.01)

(52) U.S. Cl.
CPC .................................... *H04J 3/06* (2013.01)

(58) Field of Classification Search
None
See application file for complete search history.

(56) References Cited

U.S. PATENT DOCUMENTS

| 5,838,624 A * | 11/1998 | Pilling | G11C 17/18 327/525 |
|---|---|---|---|
| 2012/0207470 A1 * | 8/2012 | Djordjevic | H04B 10/25 398/44 |

* cited by examiner

*Primary Examiner* — Christopher Crutchfield
*Assistant Examiner* — Tito Pham
(74) *Attorney, Agent, or Firm* — Gerald Chan; Carleton Clauss; Keith Taboada

(57) ABSTRACT

A multiplexer (MUX) configured to receive a plurality of input data streams and output an output data stream via an output data line based at least in part upon a control signal, includes: a first circuit portion corresponding to a first data stream of the plurality of input data streams, comprising: a first internal node; a first control switch operable to connect the output data line to the first internal node of the first circuit portion based at least in part upon the control signal, wherein the first internal node has a value corresponding to the first data stream when the output data line is connected to the first internal node; and a first reset switch operable to connect the first internal node to a common mode voltage rail based at least in part upon the control signal to remove or reduce residual charge at the first internal node.

10 Claims, 8 Drawing Sheets

```
┌─────────────────────────────────────────────────────────────────┐
│  Receiving a first control signal and a second control signal,  │
│  wherein the second control signal is an inverse of the first   │
│  control signal                                                 │
│                              302                                │
└─────────────────────────────────────────────────────────────────┘
                                │
                                ▼
┌─────────────────────────────────────────────────────────────────┐
│  Operating a first control switch in a MUX based on the first   │
│  control signal to connect an output data line to a first       │
│  internal node in the MUX, wherein the first internal node has  │
│  a value corresponding to a first input data stream when the    │
│  output data line is connected to the first internal node      │
│                              304                                │
└─────────────────────────────────────────────────────────────────┘
                                │
                                ▼
┌─────────────────────────────────────────────────────────────────┐
│  Operating a first reset switch in the MUX based on the second  │
│  control signal to connect the first internal node to a common  │
│  mode voltage rail to remove or reduce residual charge at the   │
│  first internal node                                            │
│                              306                                │
└─────────────────────────────────────────────────────────────────┘
                                │
                                ▼
┌─────────────────────────────────────────────────────────────────┐
│  Operating a second control switch in the MUX to connect the    │
│  output data line to a second internal node in the MUX, wherein │
│  the second internal node has a value corresponding to a second │
│  input data stream when the output data line is connected to    │
│  the second internal node                                       │
│                              308                                │
└─────────────────────────────────────────────────────────────────┘
                                │
                                ▼
┌─────────────────────────────────────────────────────────────────┐
│  Operating a second reset switch in the MUX to connect the      │
│  second internal node to the common mode voltage rail to remove │
│  or reduce residual charge at the second internal node          │
│                              310                                │
└─────────────────────────────────────────────────────────────────┘

MUX FOR SERDES TRANSMITTER HAVING LOW DATA JITTER

FIELD OF THE APPLICATION

The subject disclosure relates to serializer/deserializer (SerDes) transmitters.

BACKGROUND

SerDes transmitters may be used in many applications to combine multiple data streams into a single data stream. Many SerDes transmitters utilize a multiplexer (MUX) in order to combine a plurality of individual data streams, which can then be sampled to form a single combined data stream that comprises alternately sampled data from each of the individual data streams.

However, in many MUXs for SerDes transmitters, residual charges left on the internal nodes of the MUX between samples of a particular data stream may affect the output rising edge and amplitude of the sampled data, causing data jitter that reduces the available window for sampling data. For example, data jitter caused by residual charge may reduce the sampling window for a SerDes transmitter by 1-2 picoseconds. In high speed applications, such as 32 gigabits per second applications, the sampling window may be small (e.g., about 30 picoseconds). Thus, even a 1-2 picoseconds reduction in sampling time can significantly reduce the sampling time for a SerDes transmitter. As SerDes transmitters continue to increase in speed and data rate, this reduction in sampling period caused by data jitter is an increasingly significant problem.

SUMMARY

A SerDes transmitter that is able to eliminate residual charges between samples would be desirable.

A multiplexer (MUX) configured to receive a plurality of input data streams and output an output data stream via an output data line based at least in part upon a control signal, includes: a first circuit portion corresponding to a first data stream of the plurality of input data streams, comprising: a first internal node; a first control switch operable to connect the output data line to the first internal node of the first circuit portion based at least in part upon the control signal, wherein the first internal node has a value corresponding to the first data stream when the output data line is connected to the first internal node; and a first reset switch operable to connect the first internal node to a common mode voltage rail based at least in part upon the control signal to remove or reduce residual charge at the first internal node.

A multiplexer (MUX) configured to receive a plurality of input data streams and output an output data stream via an output data line based at least in part upon a control signal, includes: a first circuit portion and a second circuit portion coupled to the first circuit portion. The first circuit portion includes a first internal node, a first control switch coupled to the first internal node, a first reset switch coupled to the first internal node, a second internal node, a second control switch coupled to the second internal node, and a second reset switch coupled to the second internal node. The second circuit portion includes a third internal node, a third control switch coupled to the third internal node, a third reset switch coupled to the third internal node, a fourth internal node, a fourth control switch coupled to the fourth internal node, and a fourth reset switch coupled to the fourth internal node.

A method performed by a multiplexer (MUX) includes: receiving a first control signal and a second control signal, wherein the second control signal is an inverse of the first control signal; operating a first control switch in the MUX based on the first control signal to connect an output data line to a first internal node in the MUX, wherein the first internal node has a value corresponding to a first input data stream when the output data line is connected to the first internal node; and operating a first reset switch in the MUX based on the second control signal to connect the first internal node to a common mode voltage rail to remove or reduce residual charge at the first internal node.

Other aspects and features will be evident from reading the following detailed description.

BRIEF DESCRIPTION OF THE DRAWINGS

The drawings illustrate the design and utility of various examples, in which similar elements are referred to by common reference numerals. These drawings are not necessarily drawn to scale. In order to better appreciate how the above-recited and other advantages and objects are obtained, a more particular description of the examples will be rendered which are illustrated in the accompanying drawings. These drawings depict only examples and are not therefore to be considered limiting of the scope of the claims.

FIG. 2-1 illustrates a schematic diagram of a MUX.
FIG. 2-2 illustrates a portion of the MUX of FIG. 2-2.
FIGS. 3-1 and 3-2 illustrate a MUX during different clock cycles.
FIG. 3-3 illustrates a method performed by a MUX.
FIGS. 4-1 and 4-2 illustrate graphs of data stream waveforms generated without and with use of reset switches.

DETAILED DESCRIPTION

Figure 1:
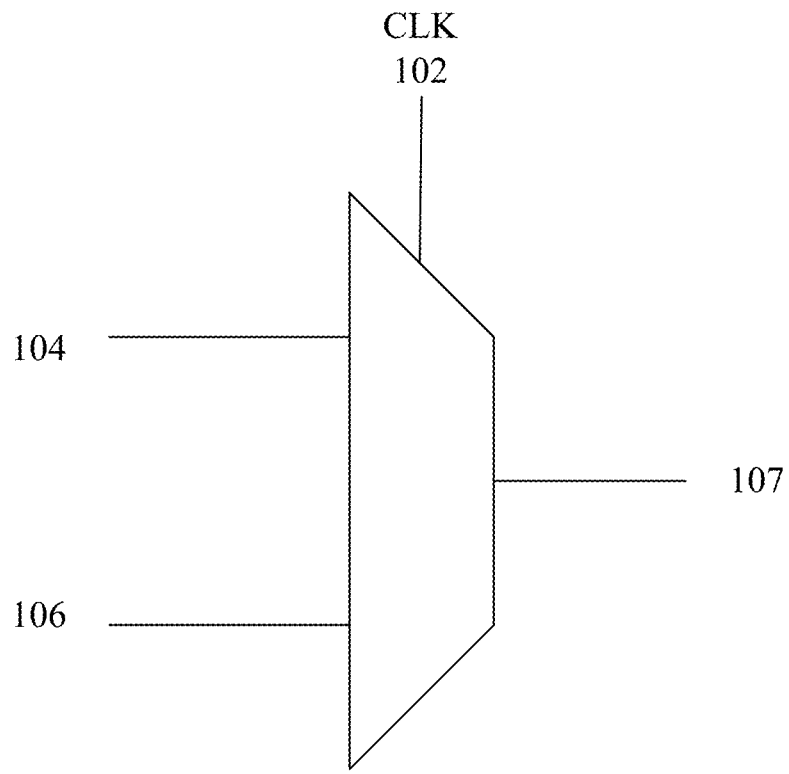
FIG. 1 illustrates a MUX used in a SerDes transmitter.

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example needs not have all the aspects or advantages shown. An aspect or an advantage described in conjunction with a particular example is not necessarily limited to that example and can be practiced in any other examples, even if not so illustrated, or if not explicitly described.

In accordance with one or more examples described herein, a MUX for a SerDes transmitter includes reset switches for eliminating residual charges left on the internal nodes of the MUX between samples of a particular data stream. The MUX may include a first circuit portion having a first reset switch and a second reset switch, and a second circuit portion having a third reset switch and a fourth reset switch. The first circuit portion is configured to receive and process a first data stream, and the second circuit portion is configured to receive and process a second data stream. The first reset switch and the second reset switch are configured to eliminate residual charges on internal nodes in the first circuit portion, and the third reset switch and the fourth reset switch are configured to eliminate residual charges on internal nodes in the second circuit portion.

FIG. 1 illustrates a multiplexer (MUX) 100 that may be used in some SerDes transmitters. MUX 100 may be a 2:1 MUX used to receive a first data stream 104 and a second data stream 106, and to output an output data stream 107. In some cases, the output data stream 107 may be a combined data stream formed by the first data stream 104 and the second data stream 106. Also, in some cases, the MUX 100 functions as a latch, wherein during a clock's positive pulse, the MUX 100 latches the first data stream 104, and during negative pulse, the MUX 100 latches the second data stream 106. It should be noted that the MUX 100 is not limited to be a 2:1 MUX, and that the MUX 100 may be any of other types of MUXs (e.g., a 3:1 MUX).

During use, the MUX 100 is controlled by a signal 102 that determines which data stream to sample from. In some cases, signal 102 is a clock signal. For example, during every positive clock cycle, first data stream 104 is sampled, while during every negative clock cycle, second data stream 106 is sampled. Thus output data stream 107 may comprise alternating data from the first and second data streams 104 and 106. In some cases, the first data stream 104 and the second data stream 106 may be referred to as "even" data stream and "odd" data stream, respectively.

Figures 1, 2:
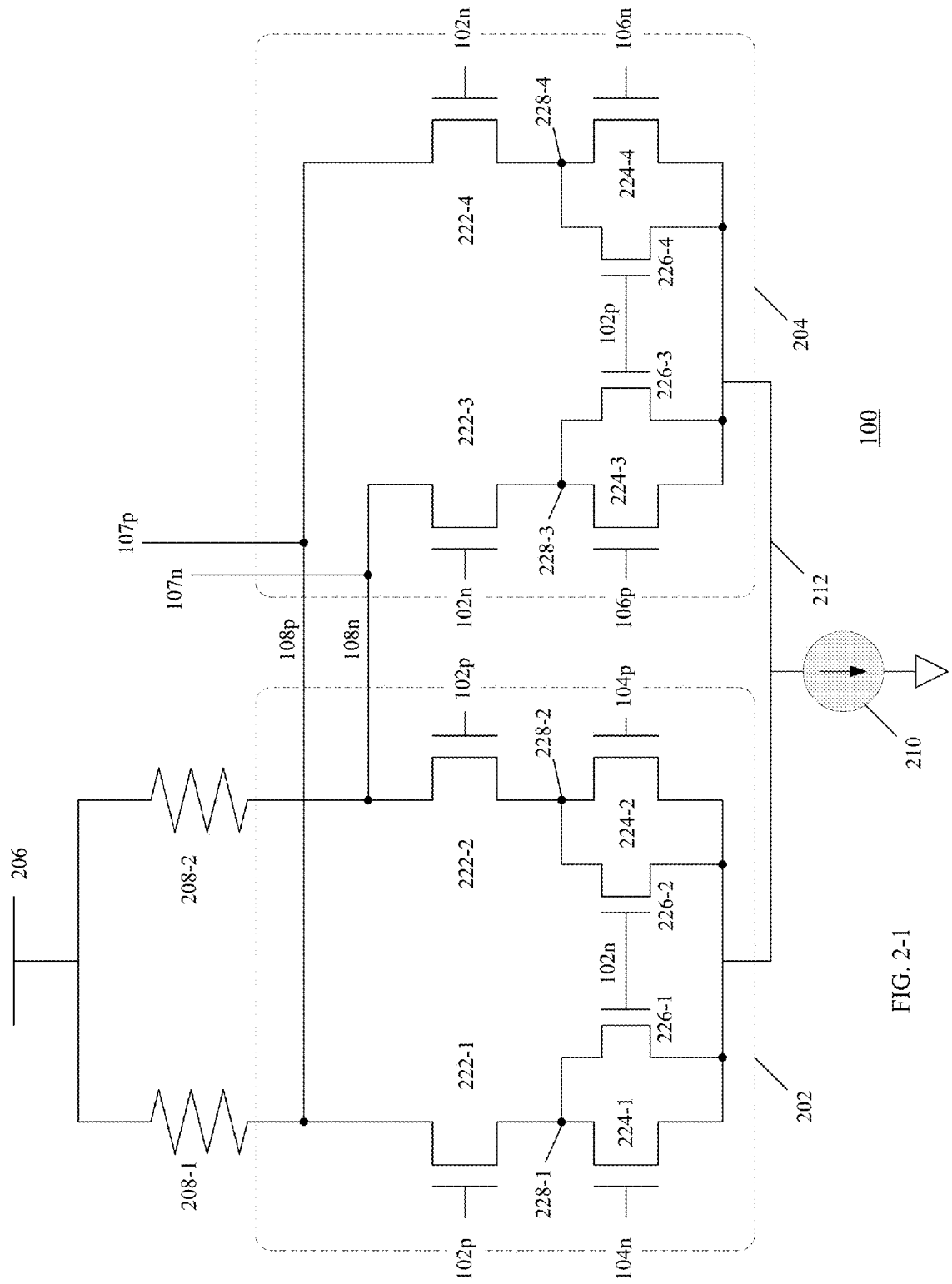
Figure 2:
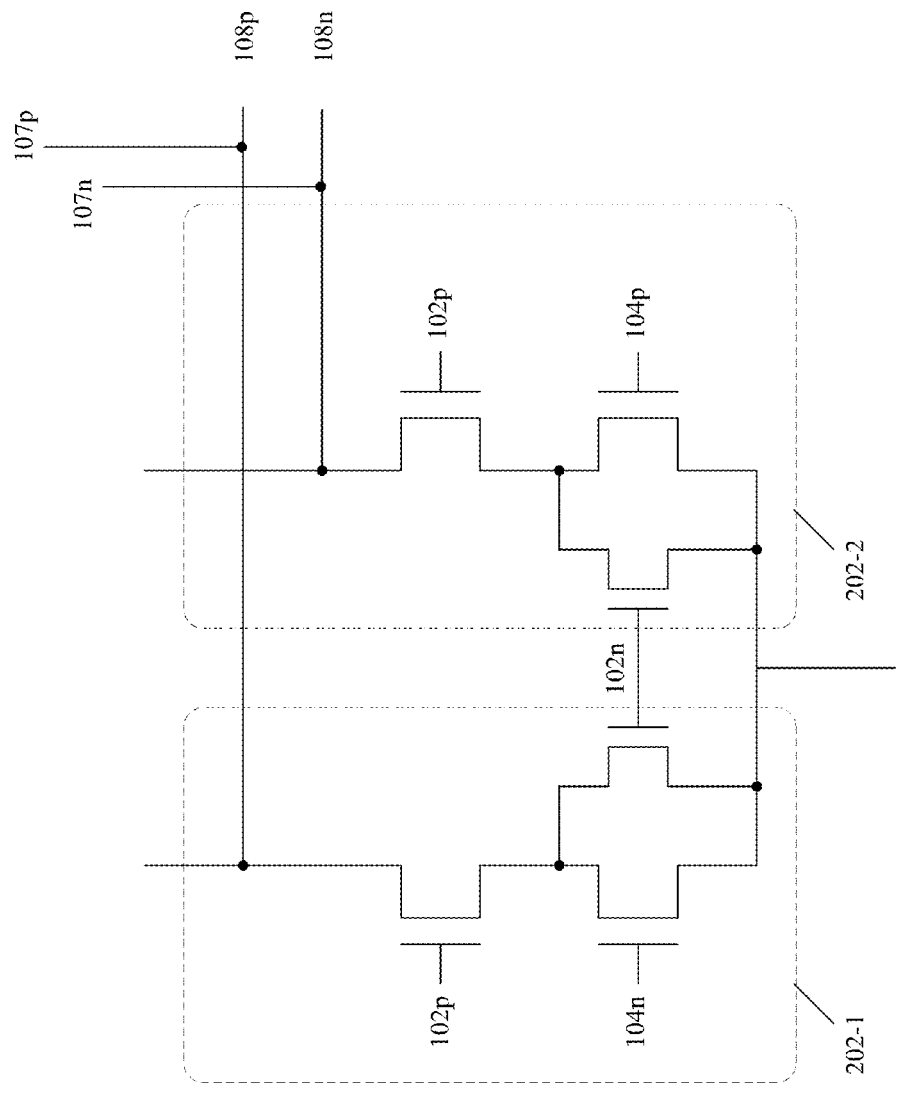

FIG. 2-1 illustrates a circuit diagram of the MUX 100. MUX 100 comprises a first circuit portion 202 (or "even circuit portion") for sampling first data stream 104, and a second circuit portion 204 (or "odd circuit portion") for sampling second data stream 106. The MUX 100 is configured to output both an output data stream 107*p*, and an inverse output data stream 107*n*, via output data line 108*p* and inverse output data line 108*n*, respectively. Alternatively, the MUX 100 may only output a single output data stream (e.g., an output data stream 107*p* or an inverse output data stream 107*n*). It is understood that for the purposes of the present specification, "p" may refer to any signal, while "n" may refer to the inverse or negative of that signal.

The first and second circuit portions 202 and 204 of the MUX 100 may each comprise one or more control switches 222, one or more input transistors 224, and one or more reset switches 226. In the illustrated figure, there are two control switches 222 (e.g., first and second control switches 222-1 and 222-2) in the first circuit portion 202, and two control switches 222 (e.g., third and fourth control switches 222-3 and 222-4) in the second circuit portion 204. Also, there are two input transistors 224 (e.g., first and second input transistors 224-1, 224-2) in the first circuit portion 202, and two input transistors 224 (e.g., third and fourth input transistors 224-3, 224-4) in the second circuit portion 204. In addition, there are two reset switches 226 (e.g., first and second reset switches 226-1, 226-2) in the first circuit portion 202, and two reset switches 226 (e.g., third and fourth reset switches 226-3, 226-4) in the second circuit portion 204.

In other cases, the number of control switches 222, the number of input transistors 224, and the number of reset switches 226 may be different from the examples discussed. For example, in other cases, each of the first circuit portion 202 and the second circuit portion 204 may have only one control switch 222, or more than two control switches 222. In addition, in other cases, each of the first circuit portion 202 and the second circuit portion 204 may have only one input transistor 224, or more than two input transistors 224. Also, in other cases, each of the first circuit portion 202 and the second circuit portion 204 may have only one reset switch 226, or more than two reset switches 226.

In the illustrated figure, the control switches 222, the input transistors 224, and the reset switches 226 are NMOS transistors, such that the first and second circuit portions 202 and 204 are pull-down circuits. In other cases, the control switches 222, the input transistors 224, and the reset switches 226 may instead be PMOS transistors (wherein first and second circuit portions 202 and 204 are configured to be pull-up circuits). In further cases, the control switches 222, the input transistors 224, and the reset switches 226 may be any of other types of switches, or a combination of any of the types of switches mentioned previously.

As shown in FIG. 2-1, the first circuit portion 202 also has a first internal node 228-1, to which the first control switch 222-1 and the first reset switch 226-1 are coupled. The first circuit portion 202 also has a second internal node 228-2, to which the second control switch 222-2 and the second reset switch 226-2 are coupled. Similarly, the second circuit portion has a third internal node 228-3, to which the third control switch 222-3 and the third reset switch 226-3 are coupled. The second circuit portion 204 also has a fourth internal node 228-4, to which the fourth control switch 222-4 and the fourth reset switch 226-4 are coupled. The output data line 108*p* and the inverse output data line 108*n* connect the first circuit portion 202 and the second circuit portion 204.

Also, as shown in FIG. 2-1, the first input transistor 224-1 is coupled to the first internal node 228-1, the second input transistor 224-2 is coupled to the second internal node 228-2, the third input transistor 224-3 is coupled to the third internal node 228-3, and the fourth input transistor 224-4 is coupled to the fourth internal node 228-4. The first input transistor 224-1 and the first reset switch 226-1 are arranged in parallel, the second input transistor 224-2 and the second reset switch 226-2 are arranged in parallel, the third input transistor 224-3 and the third reset switch 226-3 are arranged in parallel, and the fourth input transistor 224-4 and the fourth reset switch 226-4 are arranged in parallel. Also, the first control switch 222-1 and the first input transistor 224-1 are arranged in series, the second control switch 222-2 and the second input transistor 224-2 are arranged in series, the third control switch 222-3 and the third input transistor 224-3 are arranged in series, and the fourth control switch 222-4 and the fourth input transistor 224-4 are arranged in series.

Also, as shown in FIG. 2-1, the first circuit portion 202 and the second circuit portion 204 is connected to a supply voltage 206 through one or more resistors 208. Also, as shown in the figure, the MUX 100 has a first resistor 208-1 associated with the output data line 108*p*, and a second resistor 208-2 associated with the inverse output data line 108*n*. In addition, the first and second circuit portions 202 and 204 may be connected to ground through a constant DC current source 210, creating a common mode voltage rail 212. In some cases, the current source 210 helps keep the output voltage swing constant across all process regions. Without the current source 210, there may be a large variation in output current flowing through the resistors, which may lead to large variations in output voltage swing. In other cases, the first circuit portion 202 and the second circuit portion 204 may be connected directly to ground.

As mentioned previously, the plurality of reset switches 226 are configured to solve the problem of residual charges. In some cases, the reset switches 226 are configured to remove or reduce residual charges at internal nodes 228 by resetting the voltage of the internal nodes 228 to a common node voltage corresponding to the common mode voltage rail 212 when the first circuit portion 202 or the second circuit portion 204 is in an inactive mode. The operation of the reset switches 226 will be described in detail below.

As shown in FIG. 2-2, in some cases, the first circuit portion 202 may be considered as having a positive circuit portion 202-1 connected to transmit the output data stream 107p via the output data line 108p, and a negative circuit portion 202-2 connected to transmit the inverse output data stream 107n via the inverse output data line 108n. Similar is true with respect to the second circuit portion 204. In particular, the second circuit portion 204 may be similarly configured as the first circuit portion 202 to have a positive circuit portion and a negative circuit portion. In other cases where the MUX 100 has the output data line 108p and no inverse output data line 108n, then the first circuit portion 202 may include the positive circuit portion 202-1, and does not have the negative circuit portion 202-2. In such cases, the second circuit portion 204 may be similarly configured as the first circuit portion 202 to have the positive circuit portion, and does not have the negative circuit portion.

The operation of the MUX 100 of FIG. 2-1 will now be described. During use, the first input transistor 224-1 is configured to receive a first data stream (e.g., first data stream 104), and the second input transistor 224-2 is configured to receive an inverse of the first data stream. Also, the third input transistor 224-3 is configured to receive a second data stream (e.g., second data stream 106), and the fourth input transistor 224-4 is configured to receive an inverse of the second data stream. The input transistors 224 are used to set the values of the internal nodes 228 when their respective circuit portions (202 or 204) are "active." Thus, the values of the internal nodes 228 are based at least in part upon the states of the input transistors 224.

For example, the input transistors 224-1 and 224-2 of the positive and negative portions 202-1 and 202-2 in the first circuit portion 202 may receive gate inputs from the inverse first data stream 104n and the first data stream 104p, respectively. When the first circuit portion 202 is "active," the values of the internal nodes 228-1 and 228-2 will be set based upon these gate signals of the input transistors 224-1 and 224-2, respectively. For example, when the first data stream 104 (or 104p) has a high value (e.g., a logical "1"), the input transistor 224-1 will be in an "OFF" state (due to it receiving a low signal, or logical "0," from the inverse first data stream 104n). This results in the internal node 228-1 being coupled to the supply voltage 206 and returning a high value to the output data stream for transmission via the output data line 108p. On the other hand, the input transistor 224-2 will receive a high gate value, and thus will be in an "ON" state. The internal node 228-2 will thus have a lower value corresponding to a voltage drop over the resistor 208-2, and will return a low value to the inverse output data stream for transmission via the inverse output data line 108n. If the first data stream 104 (or 104p) has a low value (e.g., a logical "0"), then the situation is reversed, with a low value being returned to the output data stream for transmission via the output data line 108p, and a high value to the inverse output data stream for transmission via the inverse output data line 108n. The above features also apply for the second circuit portion 204.

The control switches 222 are operable based on a control signal (e.g., the clock signal 102) to connect the output data line 108p and the inverse output data line 108n to the first circuit portion 202 or the second circuit portion 204 of the MUX 100. For example, in some cases, control switches 222-1 and 222-2 of the first circuit portion 202 are controlled by the clock signal 102p (received at the gates of control switches 222-1 and 222-2), while control switches 222-3 and 222-4 of second circuit portion 204 are controlled by the inverse clock signal 102n that is inverse of the clock signal 102p controlling the first circuit portion 202. Thus, during a positive clock cycle (e.g., clock signal 102p is high, while inverse clock signal 102n is low), the control switches 222-1 and 222-2 of the first circuit portion 202 are closed (e.g., have an "ON" state), connecting the output data line 108p and the inverse output data line 108n to internal nodes 228-1 and 228-2 of the first circuit portion 202, respectively. The internal nodes 228-1 and 228-2 will have charge/value corresponding to the value of the first data stream 104 when the output data lines 108n, 108p are connected to the internal nodes 228-1, 228-2. Thus, the values of the internal nodes 228 are based on the states of the control switches 222. At the same time, the control switches 222-3 and 222-4 of the second circuit portion 204 are open, disconnecting the output data line 108p and the inverse output data line 108n from internal nodes 228-3 and 228-4 of the second circuit portion 204.

On the other hand, during a negative clock cycle (e.g., clock signal 102p is low, while inverse clock signal 102n is high), the opposite occurs. In particular, during a negative clock cycle, the control switches 222-3 and 222-4 of the second circuit portion 204 are controlled based on the inverse clock signal 102n (received at the gates of control switches 222-3 and 222-4), while control switches 222-1 and 222-2 of first circuit portion 202 are controlled based on the clock signal 102p. Thus, during a negative clock cycle, the control switches 222-3 and 222-4 of the second circuit portion 204 are closed, connecting the output data line 108p and the inverse output data line 108n to internal nodes 228-3 and 228-4 of the second circuit portion 204, respectively. The internal nodes 228-3 and 228-4 will have value/charge corresponding to the value of the second data stream 106. At the same time, the control switches 222-1 and 222-2 of the first circuit portion 202 are open, disconnecting the output data line 108p and the inverse output data line 108n from internal nodes 228-1 and 228-2 of the first circuit portion 202.

Figures 1, 3:
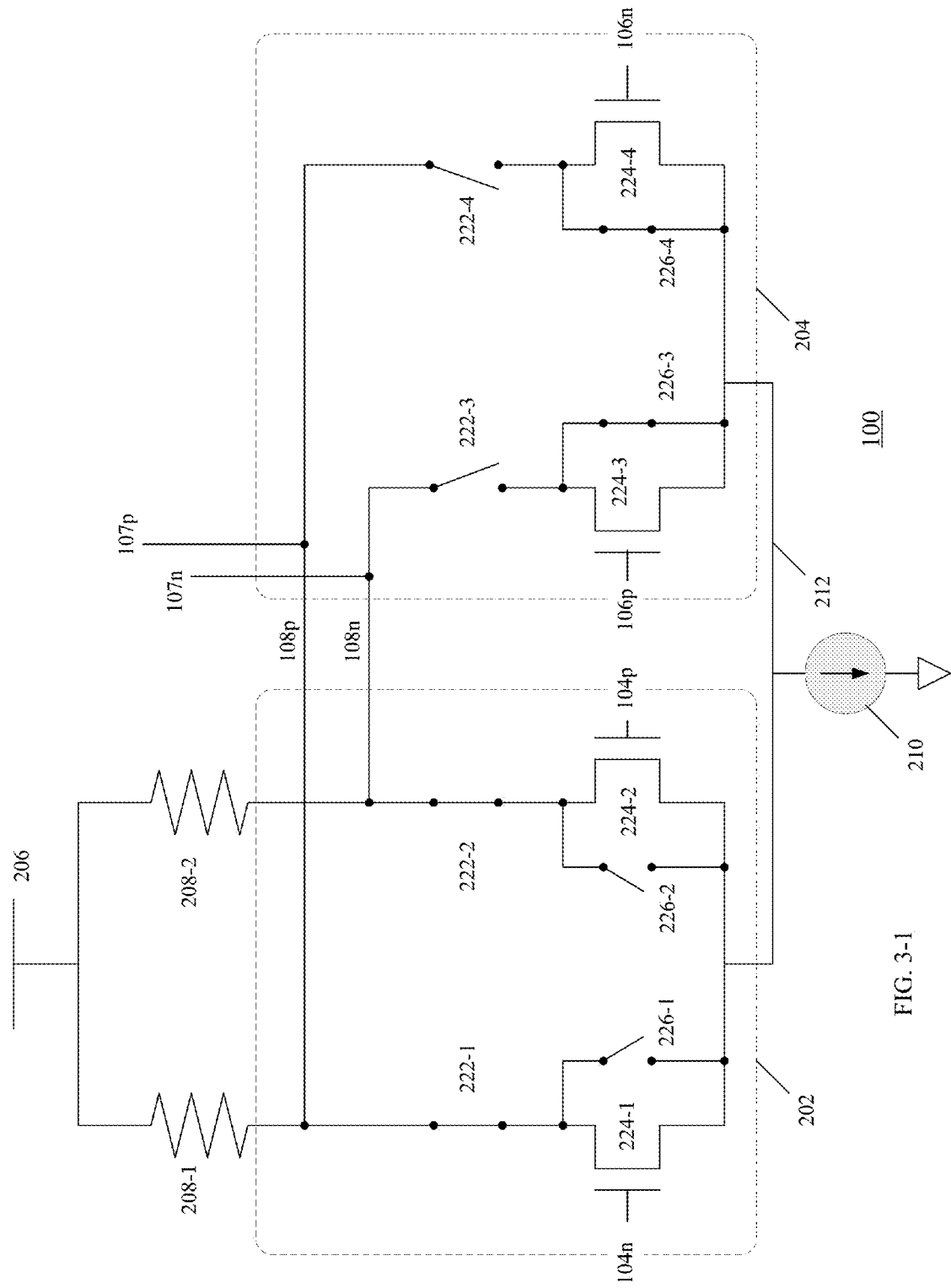
Figures 2, 3:
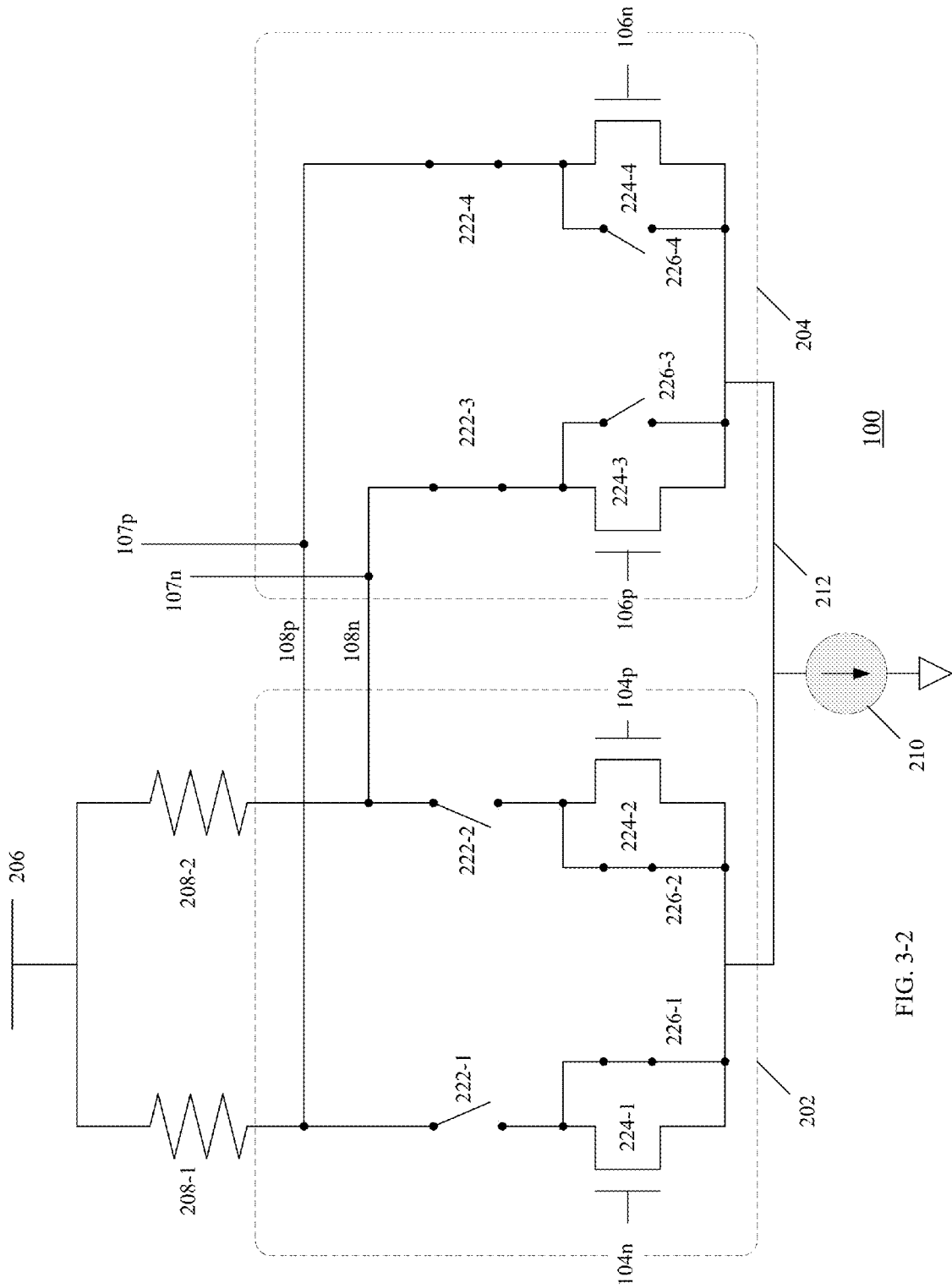

The first circuit portion 202 may be considered as being in "active mode" when the control switches 222-1 and 222-2 are closed (thus connecting the first circuit portion 202 to output data line 108p and the inverse output data line 108n), and being in "inactive mode" when the control switches 222-1 and 222-2 are open. Similarly, the second circuit portion 204 may be considered as being "active" or "inactive" depending on the state of the control switches 222-3 and 222-4. In particular, the second circuit portion 204 may be described as being in "active mode" when the control switches 222-3 and 222-4 are closed (thus connecting the second circuit portion 204 to the output data line 108p and the inverse output data line 108n), and being in "inactive mode" when the control switches 222-3 and 222-4 are open. Due to their respective control switches 222 being controlled by inverse signals (clock signal 102p and inverse clock signal 102n), when the first circuit portion 202 is "active," the second circuit portion 204 is "inactive," and vice versa. Thus the output data line 108p and the inverse output data line 108n receive values from the internal nodes 228 of the first and second circuit portions 202 and 204 in an alternating fashion. Such configuration is illustrated in FIGS. 3-1 and 3-2. FIG. 3-1 illustrates the MUX 100 when the clock signal 102 is high, resulting in the first circuit portion 202 being active and the second circuit portion 204 being inactive, while FIG. 3-2 illustrates the MUX 100 when the clock signal 102 is low, resulting in the second circuit portion 204 being active and first circuit portion 202 being inactive.

However, when the first circuit portion 202 is "inactive" and is disconnected from the output data line 108*p* and the inverse output data line 108*n*, there may be residual charge on the internal nodes 228-1 and/or 228-2. This residual charge may remain on the internal nodes 228-1 and/or 228-2 until the next clock cycle when the first circuit portion 202 is active again, potentially affecting output rise times and causing data jitter. For example, a high value on the first data stream 104 when first circuit portion 202 is active may result in residual charge being stored at the internal node 228-1 when the first circuit portion 202 goes inactive. This charge may affect subsequent values of first data stream 104 (e.g., a subsequent high value on first data stream 104 may result in output data stream experiencing a faster rise time due to the residual charge already on the internal node 228-1). The second circuit portion 204 may experience similar problems due to residual charges on the internal node 228-3 and 228-4 when the second circuit portion 204 is in the inactive mode.

To address the problem of residual charges, the reset switches 226 reset the voltage of the internal nodes 228 to a common node voltage corresponding to the common mode voltage rail 212 when the first circuit portion 202 or the second circuit portion 204 is in the inactive mode. In some cases, the reset switches 226 may do so by connecting the internal nodes 228 to the common mode voltage rail 212. In some cases, the reset switches 226 are controlled by a signal that is the inverse to that controlling the control switches 222. For example, the reset switches 226-1 and 226-2 in the first circuit portion 202 may have gates connected to the inverse clock signal 102*n*, while the reset switches 226-3 and 226-4 have gates connected to the clock signal 102*p*. Therefore, when the clock signal 102 is high (e.g., clock signal 102*p* is high, and inverse clock signal 102*n* is low), the first circuit portion 202 is in active mode (due to the control switches 222-1 and 222-2 being closed). Because the reset switches 226-1, 226-2 are controlled by a control signal that is the inverse to that controlling the control switches 222-1, 222-2, the reset switches 226-1 and 226-2 are operated to open base on the control signal. Thus, the internal nodes 228-1 and 228-2 are not connected to the common mode voltage rail 212 through the reset switches 226-1 and 226-2. At the same time, the second circuit portion 204 is in inactive mode, and the reset switches 226-3 and 226-4 are operated to close, connecting the internal nodes 228-3 and 228-4 to the common mode voltage rail 212. Thus the internal nodes 228-3 and 228-4 are reset to the same voltage as common mode voltage rail 212, and any residual charges that may be stored at those internal nodes are drained to the common mode voltage rail 212.

Similarly, when the clock signal is low (e.g., clock signal 102*p* is low, and inverse clock signal 102*n* is high), the control switches 222-1, 222-2 are operated to open to cause the first circuit portion 202 to enter the inactive mode. Because the reset switches 226-1, 226-2 are controlled by a control signal that is the inverse to that controlling the control switches 222-1, 222-2, the reset switches 226-1 and 226-2 are operated to close base on the control signal, resetting the internal nodes 228-1 and 228-2 to the voltage of the common mode voltage rail 212. At the same time, the reset switches 226-3 and 226-4 are operated to be opened, and thus do not affect the input transistors 224-3, 224-4 and their effect on the internal nodes 228-3, 228-4.

Because the internal nodes 228 are reset to the same voltage as the common mode voltage rail 212 whenever their associated circuit portion is in the inactive mode, output rise times will be the same during the active mode, regardless of what value was in the previous active mode. Thus, data-dependent jitter due to residual charges on the nodes 228 is eliminated.

In some cases, transistors may be used for resetting the reset switches 226. Such resistors may be small in comparison to those used for the control switches 222 and the input transistors 224. This is because the reset switches 226 are only closed when their associated circuit portion is inactive, and do not experience high current levels. Thus the reset switches 226 may be implemented for the MUX 100 with minimal additional area overhead.

As illustrated in the above example and shown in FIG. 3-3, a method 300 performed by a multiplexer (MUX) may include: receiving a first control signal and a second control signal, wherein the second control signal is an inverse of the first control signal (item 302); operating a first control switch 222 in the MUX based on the first control signal to connect an output data line to a first internal node 228 in the MUX, wherein the first internal node 228 has a value corresponding to a first input data stream when the output data line 108 is connected to the first internal node 228 (item 304); and operating a first reset switch 226 in the MUX based on the second control signal to connect the first internal node 228 to a common mode voltage rail 212 to remove or reduce residual charge at the first internal node 228 (item 306). In some cases, the method may optionally further include: operating a second control switch 222 in the MUX to connect the output data line to a second internal node 228 in the MUX, wherein the second internal node 228 has a value corresponding to a second input data stream when the output data line 108 is connected to the second internal node 228 (item 308); and operating a second reset switch 226 in the MUX to connect the second internal node 228 to the common mode voltage rail 212 to remove or reduce residual charge at the second internal node 228 (item 310). Also, as illustrated in the above example, the first control switch and the second control switch are operated based on inverse signals with respect to each other. In addition, in some cases, the output data line 108 and the common mode voltage rail 212 are alternately connected to the first and second internal nodes 228 based at least in part upon the first and second control signals.

Figures 1, 4:
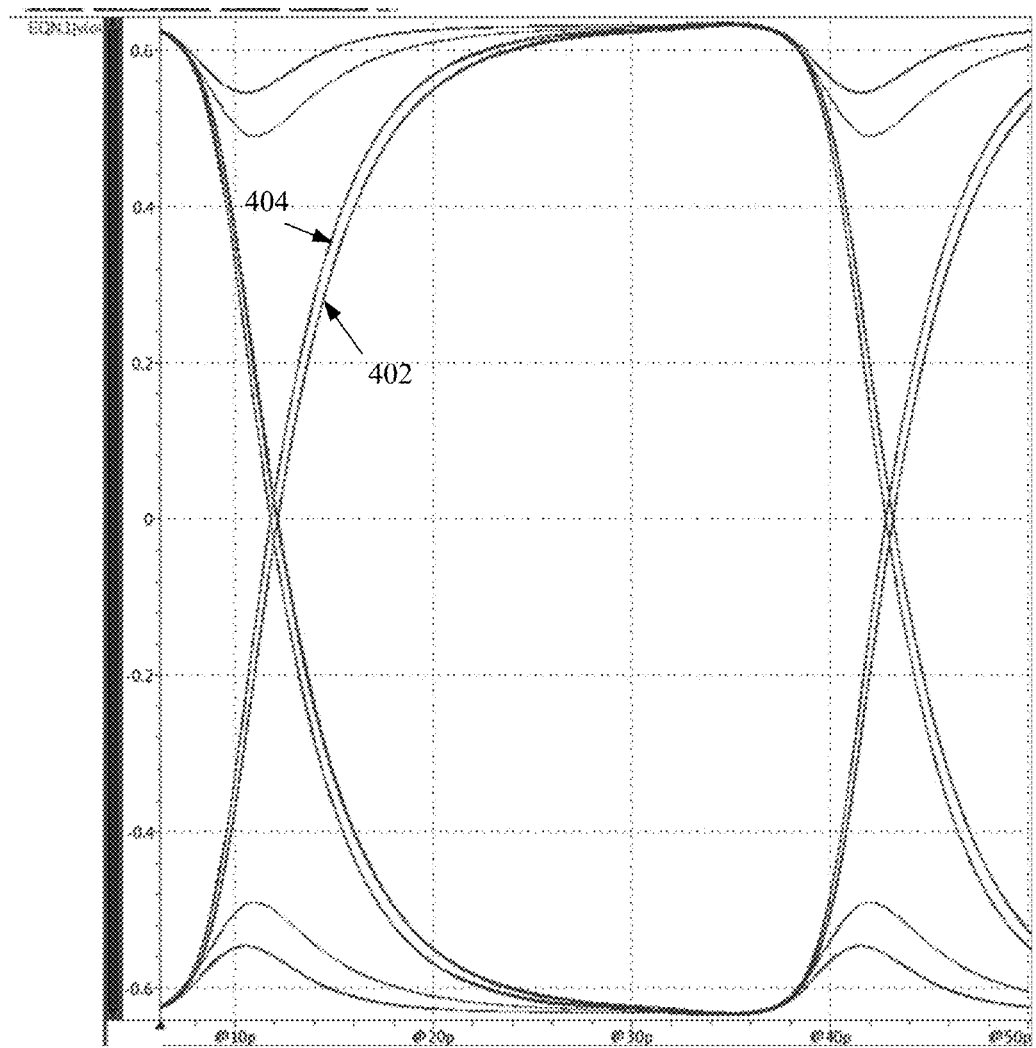
Figures 2, 4:
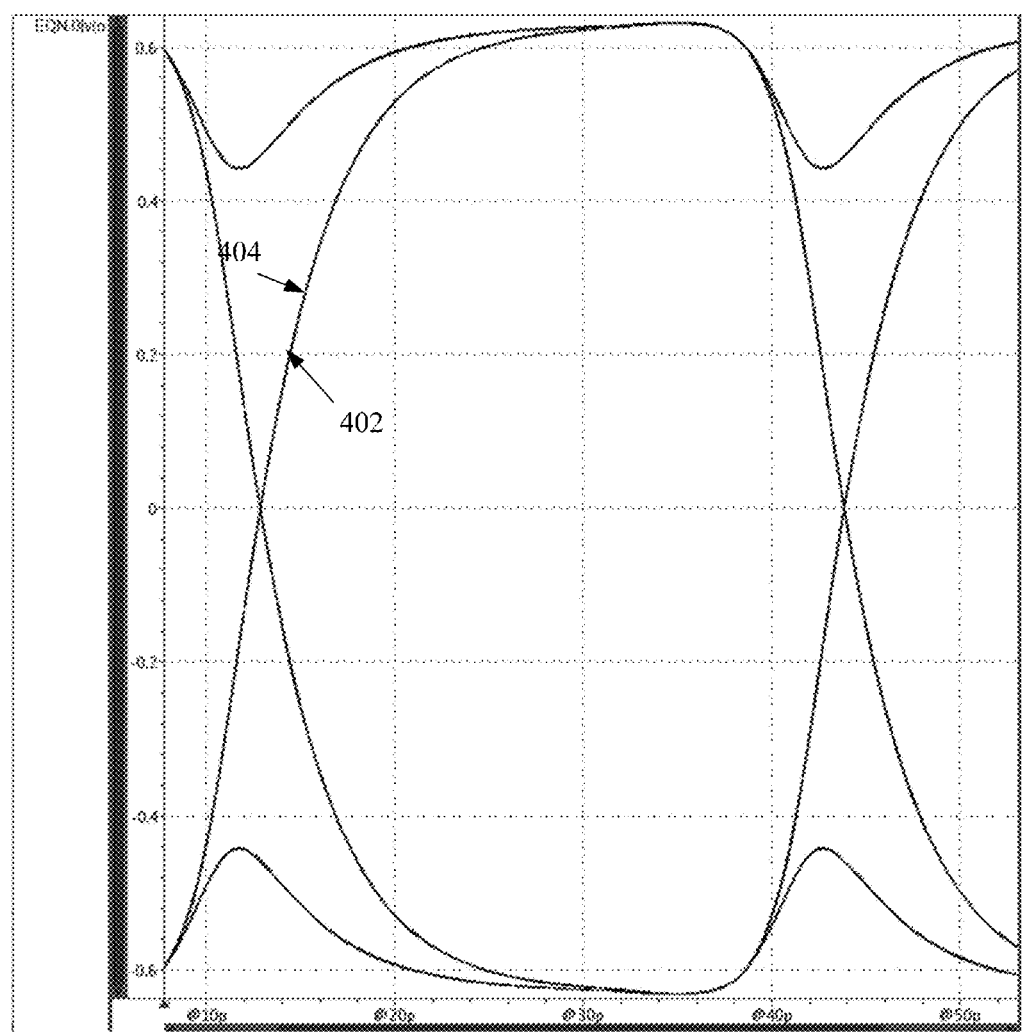

FIG. 4-1 illustrates a waveform graph of an output data stream generated without use of reset switches, and FIG. 4-2 illustrates a waveform graph of an output data stream generated with use of reset switches (such as the reset switches 226-1, 226-2, 226-3, and 226-4 described with reference to FIGS. 2-3). The illustrated graphs show a first curve 402, and a second curve 404, representing rising outputs of an output data stream (e.g., sampling a high value on a first/even data stream, following a low value on a second/odd data stream). The first curve 402 represents a rising output without residual charge on the nodes of the sampling circuit portion, while second curve 404 represents a rising output following a previously sampled high value on the sampling circuit portion. If no reset switches were used, then the previously sampled high value may have caused residual charge to the stored on the nodes of the sampling circuit portion, changing the output rise time and causing data-dependent jitter.

For example, in FIG. 4-1, where no reset switches are used, the output rise time of the output data stream will be different on curve 402 in comparison with curve 404, due to residual charges on the nodes of the sampling circuit portion causing curve 404 to rise faster. This difference in rise times results in undesirable data-dependent jitter. In the illustrated example of FIG. 4-1, the data-dependent jitter without the use of reset switches is approximately 0.4 ps.

On the other hand, in FIG. 4-2, because residual charge is drained from the internal nodes of the sampling circuit portion using reset switches (such as the reset switches 226-1, 226-2, 226-3, and 226-4 described with reference to FIGS. 2-3) between samples, the gap between curves 402 and 404 is much smaller due to curve 404 not being affected by residual charge. Note that because the gap is so small, the two curves 402, 404 appear as one line in the graph. For example, in the illustrated example of FIG. 4-2, the data-dependent jitter with the use of reset switches is approximately 0.036 ps, which is much lower than if the reset switches were not used.

In some cases, the various features described with respect to the MUX 100 may be for a SerDes transmitter on an FPGA. In other cases, the various features described herein may be provided for any integrated circuit, which may or may not be a FPGA. For example, in other cases, the various features described herein may be provided for other types of processors.

It should be noted that the terms "first", "second", "third", "fourth", as used in this specification, are used to identify different items, and that these terms may be interchanged. For example, while the reset switches 226-1 to 226-4 have been described as "first reset switch 226-1", "second reset switch 226-2", "third reset switch 226-3", and "fourth reset switch 226-4", in other examples, the reset switches 226-1 to 226-4 may be identified differently. For example, in other cases, instead of being a "third" reset switch, the reset switch 226-3 may be labeled as "second" reset switch 226-3, etc. Similar applies for the labeling of the control switches 222, the input transistors 224, and the internal nodes 228. For example, in other cases, instead of being a "third" control switch, the control switch 222-3 may be labeled as a "second" control switch 222-3, etc. As another example, in other cases, instead of being a "third" internal node, the internal node 228-3 may be labeled as a "second" internal node 228-3, etc.

Although particular examples have been shown and described, it will be understood that it is not intended to limit the claimed inventions to the preferred examples, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A multiplexer (MUX) configured to receive a plurality of input data streams and output an output data stream via an output data line based at least in part upon a control signal, comprising:
   a first circuit portion entirely in the MUX, the first circuit portion corresponding to a first data stream of the plurality of input data streams, comprising:
   a first internal node;
   a first control switch operable to connect the output data line to the first internal node of the first circuit portion based at least in part upon the control signal, wherein the first internal node has a value corresponding to the first data stream when the output data line is connected to the first internal node; and
   a first reset switch operable to connect the first internal node to a common mode voltage rail based at least in part upon the control signal to remove or reduce residual charge at the first internal node.

2. The MUX of claim 1, further comprising a second circuit portion in the MUX, the second circuit portion corresponding to a second data stream of the plurality of input data streams, the second circuit portion comprising:
   a second internal node;
   a second control switch operable to connect the output data line to the second internal node of the second circuit portion, wherein the second internal node has a value corresponding to the second data stream when the output data line is connected to the second internal node; and
   a second reset switch operable to connect the second internal node to the common mode voltage rail to remove or reduce residual charge at the second internal node.

3. The MUX of claim 2, wherein the first control switch and the second control switch receive inverse signals with respect to each other.

4. The MUX of claim 1, wherein the control signal comprises a clock signal.

5. The MUX of claim 1, wherein the first control switch comprises a gate, and the first reset switch comprises a gate configured to receive a signal that is an inverse of a signal received by the gate of the first control switch.

6. The MUX of claim 1, further comprising an input transistor, wherein the value of the first internal node is based at least in part upon a state of the input transistor.

7. The MUX of claim 6, wherein the input transistor is configured to receive a signal that is an inverse of the first data stream.

8. The MUX of claim 6, wherein the first reset switch and the input transistor are arranged in parallel.

9. The MUX of claim 6, wherein the first internal node, the input transistor, and the first control switch are connected in series to a supply voltage via a resistor.

10. The MUX of claim 6, wherein the value of the first internal node is based at least in part on a state of the first control switch and the state of the input transistor.

* * * * *